US008273178B2

(12) United States Patent
Kim et al.

(10) Patent No.: US 8,273,178 B2
(45) Date of Patent: Sep. 25, 2012

(54) THIN FILM DEPOSITION APPARATUS AND METHOD OF MAINTAINING THE SAME

(75) Inventors: Se Yong Kim, Daejeon-si (KR); Woo Chan Kim, Daejeon-si (KR); Dong Rak Jung, Cheonan-si (KR)

(73) Assignee: ASM Genitech Korea Ltd., Chungcheongnam-Do (KR)

( * ) Notice: Subject to any disclaimer, the term of this patent is extended or adjusted under 35 U.S.C. 154(b) by 865 days.

(21) Appl. No.: 12/393,377

(22) Filed: Feb. 26, 2009

(65) Prior Publication Data

US 2009/0217871 A1    Sep. 3, 2009

(30) Foreign Application Priority Data

Feb. 28, 2008  (KR) .................. 10-2008-0018234

(51) Int. Cl.
*C23C 16/44* (2006.01)
*C23F 1/00* (2006.01)
*H01L 21/306* (2006.01)
*C23C 16/06* (2006.01)
*C23C 16/22* (2006.01)

(52) U.S. Cl. ..... 118/715; 118/733; 118/663; 156/345.1; 156/345.24

(58) Field of Classification Search .................. 118/715, 118/733, 663; 156/345.1, 345.24
See application file for complete search history.

(56) References Cited

U.S. PATENT DOCUMENTS

| 3,215,508 A | * | 11/1965 | Piester ............................. 422/143 |
| 3,308,709 A | | 3/1967 | Harrick |
| 3,822,946 A | | 7/1974 | Rynkowski |
| 3,907,439 A | | 9/1975 | Zanoni |
| 3,945,505 A | | 3/1976 | Frisbie et al. |
| 4,024,944 A | | 5/1977 | Adams et al. |
| 4,058,430 A | | 11/1977 | Suntola et al. |
| 4,107,539 A | | 8/1978 | Kirsch |
| 4,148,344 A | | 4/1979 | Critchell et al. |
| 4,201,378 A | | 5/1980 | Hams |
| 4,228,886 A | | 10/1980 | Moran |
| 4,449,885 A | | 5/1984 | Hertel et al. |

(Continued)

FOREIGN PATENT DOCUMENTS

EP    0 282 233 A1    9/1988

(Continued)

OTHER PUBLICATIONS

ASM Europe, (Advance 400 Course Module 19), Rev. C, Jun. 1999.

(Continued)

*Primary Examiner* — Rudy Zervigon
(74) *Attorney, Agent, or Firm* — Knobbe, Martens, Olson & Bear LLP

(57) ABSTRACT

A thin film deposition apparatus and a method of maintaining the same are disclosed. In one embodiment, a thin film deposition apparatus includes: a chamber including a removable chamber cover; one or more reactors housed in the chamber; a chamber cover lifting device connected to the chamber cover. The chamber cover lifting device is configured to move the chamber cover vertically between a lower position and an upper position. The apparatus further includes a level sensing device configured to detect whether the chamber cover is level, and a level maintaining device configured to adjust the chamber cover if the chamber cover is not level. This configuration maintains the chamber cover to be level as a condition for further vertical movement of the chamber cover.

16 Claims, 4 Drawing Sheets

U.S. PATENT DOCUMENTS

| | | |
|---|---|---|
| 4,457,664 A | 7/1984 | Judell et al. |
| 4,466,073 A | 8/1984 | Boyan et al. |
| 4,482,419 A | 11/1984 | Tsukada et al. |
| 4,507,078 A | 3/1985 | Tam et al. |
| 4,523,985 A | 6/1985 | Dimock |
| 4,545,106 A | 10/1985 | Juengel |
| 4,559,451 A | 12/1985 | Curl |
| 4,618,292 A | 10/1986 | Judge et al. |
| 4,635,373 A | 1/1987 | Miyazaki et al. |
| 4,647,268 A | 3/1987 | Scholl |
| 4,697,089 A | 9/1987 | Drage |
| 4,698,511 A | 10/1987 | Sueda et al. |
| 4,698,775 A | 10/1987 | Koch et al. |
| 4,705,951 A | 11/1987 | Layman et al. |
| 4,720,635 A | 1/1988 | Uga |
| 4,730,882 A | 3/1988 | Messerschmidt |
| 4,743,769 A | 5/1988 | Schwaiger |
| 4,744,713 A | 5/1988 | Hrovath |
| 4,765,793 A | 8/1988 | Goddeau |
| 4,770,590 A | 9/1988 | Hugues et al. |
| 4,789,294 A | 12/1988 | Sato et al. |
| 4,818,169 A | 4/1989 | Schram et al. |
| 4,819,167 A | 4/1989 | Cheng et al. |
| 4,833,790 A | 5/1989 | Spencer et al. |
| 4,836,733 A | 6/1989 | Hortel et al. |
| 4,838,733 A | 6/1989 | Katz |
| 4,880,348 A | 11/1989 | Baker et al. |
| 4,907,035 A | 3/1990 | Galburt et al. |
| 4,951,601 A | 8/1990 | Maydan et al. |
| 5,044,752 A | 9/1991 | Thurfjell et al. |
| 5,162,642 A | 11/1992 | Akamatsu et al. |
| 5,194,743 A | 3/1993 | Aoyama et al. |
| 5,239,182 A | 8/1993 | Tateyama et al. |
| 5,264,918 A | 11/1993 | Kagami |
| 5,366,555 A | 11/1994 | Kelly |
| 5,483,138 A | 1/1996 | Shmookler et al. |
| 5,555,051 A | 9/1996 | Maruyama et al. |
| 5,563,798 A | 10/1996 | Berken et al. |
| 5,595,606 A | 1/1997 | Fujikawa et al. |
| 5,631,171 A | 5/1997 | Sandstrom et al. |
| 5,651,086 A | 7/1997 | Russell et al. |
| 5,667,592 A | 9/1997 | Boitnott et al. |
| 5,706,201 A | 1/1998 | Andrews |
| 5,706,930 A | 1/1998 | Sahoda et al. |
| 5,710,069 A | 1/1998 | Farkas et al. |
| 5,721,607 A | 2/1998 | Ota |
| 5,729,337 A | 3/1998 | Tanaka |
| 5,730,802 A | 3/1998 | Ishizumi et al. |
| 5,740,062 A | 4/1998 | Berken et al. |
| 5,768,125 A | 6/1998 | Zinger et al. |
| 5,783,834 A | 7/1998 | Shatas |
| 5,812,714 A | 9/1998 | Hulse |
| 5,822,213 A | 10/1998 | Huynh |
| 5,841,540 A | 11/1998 | Mondie |
| 5,844,683 A | 12/1998 | Pavloski et al. |
| 5,870,488 A | 2/1999 | Rush et al. |
| 5,870,498 A | 2/1999 | Mayer |
| 5,885,353 A | 3/1999 | Strodtbeck et al. |
| 5,900,737 A | 5/1999 | Graham et al. |
| 5,905,850 A | 5/1999 | Kaveh |
| 5,916,365 A | 6/1999 | Sherman |
| 5,917,601 A | 6/1999 | Shimazaki et al. |
| 5,923,694 A | 7/1999 | Culver |
| 5,961,169 A | 10/1999 | Kalenian et al. |
| 5,969,639 A | 10/1999 | Lauf et al. |
| 5,980,194 A | 11/1999 | Freerks et al. |
| 5,995,234 A | 11/1999 | Nishi |
| 6,026,561 A | 2/2000 | Lafond |
| 6,051,074 A | 4/2000 | Strodtbeck et al. |
| 6,075,606 A | 6/2000 | Doan |
| 6,082,950 A | 7/2000 | Altwood et al. |
| 6,086,064 A | 7/2000 | Biegelsen et al. |
| 6,090,209 A | 7/2000 | Strodtbeck et al. |
| 6,099,596 A | 8/2000 | Li et al. |
| 6,108,092 A | 8/2000 | Sandhu |
| 6,113,165 A | 9/2000 | Wen et al. |
| 6,113,733 A * | 9/2000 | Eriguchi et al. ......... 156/345.24 |
| 6,131,589 A | 10/2000 | Vogtmann et al. |
| 6,162,008 A | 12/2000 | Perkins et al. |
| 6,162,299 A | 12/2000 | Raaijmakers |
| 6,167,322 A | 12/2000 | Holbrooks |
| 6,172,756 B1 | 1/2001 | Chalmers et al. |
| 6,197,117 B1 | 3/2001 | Li et al. |
| 6,198,976 B1 | 3/2001 | Sundar et al. |
| 6,220,945 B1 | 4/2001 | Hirokawa et al. |
| 6,242,718 B1 | 6/2001 | Ferro et al. |
| 6,267,642 B1 | 7/2001 | Vogtmann et al. |
| 6,280,291 B1 | 8/2001 | Gromko et al. |
| 6,293,749 B1 | 9/2001 | Raaijmakers et al. |
| 6,305,898 B1 | 10/2001 | Yamagishi et al. |
| 6,322,116 B1 | 11/2001 | Stevens |
| 6,327,517 B1 | 12/2001 | Sundar |
| 6,331,023 B1 | 12/2001 | Goodwin et al. |
| 6,331,697 B2 * | 12/2001 | Savas ........................... 219/390 |
| 6,332,116 B1 | 12/2001 | Qian et al. |
| 6,340,405 B2 * | 1/2002 | Park ....................... 156/345.32 |
| 6,342,277 B1 | 1/2002 | Sherman |
| 6,438,449 B2 | 8/2002 | Kawamatsu et al. |
| 6,447,636 B1 * | 9/2002 | Qian et al. ............ 156/345.48 |
| 6,488,407 B1 * | 12/2002 | Kitamura et al. ............. 374/126 |
| 6,502,054 B1 | 12/2002 | Mooring et al. |
| 6,511,539 B1 | 1/2003 | Raaijmakers |
| 6,539,891 B1 | 4/2003 | Lee et al. |
| 6,615,113 B2 | 9/2003 | Kretz et al. |
| 6,624,898 B1 | 9/2003 | Chen |
| 6,665,583 B2 | 12/2003 | Kretz et al. |
| 6,683,654 B1 | 1/2004 | Haijima |
| 6,690,986 B1 | 2/2004 | Mitchell et al. |
| 6,728,596 B1 | 4/2004 | Lindseth |
| 6,764,546 B2 | 7/2004 | Raaijmakers |
| 6,771,374 B1 | 8/2004 | Rangarajan et al. |
| 6,788,891 B1 | 9/2004 | Mitsugi |
| 6,812,157 B1 | 11/2004 | Gadgil |
| 6,820,570 B2 | 11/2004 | Kilpela et al. |
| 6,823,753 B1 | 11/2004 | Beginski |
| 6,869,641 B2 | 3/2005 | Schmitt |
| 6,900,877 B2 | 5/2005 | Raaijmakers |
| 6,902,620 B1 | 6/2005 | Omstead et al. |
| 6,910,441 B2 * | 6/2005 | Jang ........................ 118/723 R |
| 6,932,871 B2 | 8/2005 | Chang et al. |
| 6,950,774 B2 | 9/2005 | Donald |
| 6,961,639 B2 | 11/2005 | Gaudon et al. |
| 7,008,802 B2 | 3/2006 | Lu |
| 7,138,336 B2 | 11/2006 | Lee et al. |
| 7,141,499 B2 | 11/2006 | Raaijmakers |
| 7,413,612 B2 * | 8/2008 | Floyd et al. ................... 118/729 |
| 7,572,340 B2 * | 8/2009 | Floyd ........................... 118/729 |
| 7,754,282 B2 * | 7/2010 | Floyd et al. ................ 427/248.1 |
| 7,858,898 B2 * | 12/2010 | Bailey et al. ................ 219/121.4 |
| 2001/0037856 A1 * | 11/2001 | Park ............................. 156/345 |
| 2002/0052052 A1 | 5/2002 | Robinson et al. |
| 2002/0122885 A1 | 9/2002 | Ahn |
| 2005/0034664 A1 | 2/2005 | Koh |
| 2005/0092249 A1 | 5/2005 | Kikpela et al. |
| 2005/0124154 A1 | 6/2005 | Park et al. |
| 2005/0271814 A1 | 12/2005 | Chang et al. |
| 2006/0276037 A1 | 12/2006 | Lee et al. |
| 2007/0089669 A1 | 4/2007 | Raaijmakers |
| 2007/0242281 A1 | 10/2007 | Beginski et al. |
| 2009/0093906 A1 | 4/2009 | Takizawa et al. |
| 2009/0217871 A1 * | 9/2009 | Kim et al. ...................... 118/663 |
| 2009/0252580 A1 | 10/2009 | Takizawa et al. |

FOREIGN PATENT DOCUMENTS

| | | |
|---|---|---|
| EP | 0 313 466 A2 | 4/1989 |
| EP | 0687749 | 12/1995 |
| ER | 0 597 637 A1 | 5/1994 |
| JP | 58-055270 | 4/1983 |
| JP | 60-024518 | 2/1985 |
| JP | 61-087352 | 5/1986 |
| JP | 361125038 | 6/1986 |
| JP | 61-184842 | 8/1986 |
| JP | 61-228639 | 10/1986 |
| JP | 62-073643 | 4/1987 |
| JP | 403012946 | 1/1991 |
| JP | 11-347975 | 12/1999 |
| JP | 2001-013309 | 1/2001 |

| | | |
|---|---|---|
| JP | 2002-110567 | 4/2002 |
| JP | 2005-093807 | 4/2005 |
| KR | 1999-0023078 | 6/1999 |
| KR | 2000-0044823 | 8/2000 |
| KR | 2000-0069146 | 11/2000 |
| KR | 2001-0046802 | 8/2001 |
| WO | WO 99/52686 | 10/1999 |
| WO | WO 00/42638 | 7/2000 |
| WO | WO 00/68977 | 11/2000 |
| WO | WO00/79576 | 12/2000 |

OTHER PUBLICATIONS

Brooks Automation, (Wafer Handling Robot), Solid State Technology, vol. 28, No. 1, Jan. 1985, p. 74.

Deguchi et al., "Alignment accuracy evaluation of x-ray lithography system SR-1," Journal of the Japan Society of Precision Engineering, 1985, vol. 51, No. 5, pp. 156-162.

GCA Corporation, (Wafertrac1006 Advertisement), Solid State Technology, vol. 28, No. 1, Jan. 1985, p. 3.

IBM Technical Disclosure Bulletin, "Automatic mask/wafer alignment system," Sep. 1985, vol. 28, No. 4, pp. 1474-1479.

IBM Technical Disclosure Bulletin, "Front wafer registration device for batch process etch end-pint detection system," Oct. 1977, vol. 20, No. 5, pp. 1756-1759.

IBM Technical Disclosusre Bulletin, "Mask Alignment for a Capacitative-Servo Disk," Sep. 1998, TDB-ACC-Np.: NN8809256, vol. No. 31, Issue No. 4, p. No. 256-259, Cross References: 0018-8689-31-4-256.

IBM Technical Disclosure Bulletin, "No-edge contact wafer orientor," Jan. 1975, vol. 17, No. 8, pp. 2220-2221.

IBM Technical Disclosure Bulletin, "Vacuum-compatible low contamination wafer-orientor system," Feb. 1986, vol. 28, No. 9, pp. 4056-4058.

Keyence Corporation Brochure, "Laser thrubeam photoelectric sensors LX2 series," Date unknown.

Petersen et al., "High-performance mass-flow sensor with integrated laminar flow micro-channels," International Conference on Solid State Sensors and Actuators—Digest of Technical Papers, 1985, pp. 361-363.

Sugimoto, S. et al., "Wafer loading and unloading robot," *Sharp Technical Journal*, No. 30,(1984), pp. 79-83.

Suntola, T., "The Handbook of Crystal Growth 3," *Thin Films and Epitaxy, Part B*: Growth Mechanisms and Dynamics, Chapter 14, Atomic Layer Epitaxy, pp. 601-663, Elsevier Science B.V. (1994).

Wojcik, Zbigniew M., "A method of automatic centering of chips, masks and semiconductor wafers," Electron Technology, 1977, vol. 10, No. 3, pp. 79-96.

* cited by examiner

THIN FILM DEPOSITION APPARATUS AND METHOD OF MAINTAINING THE SAME

CROSS-REFERENCE TO RELATED APPLICATIONS

This application claims priority to and the benefit of Korean Patent Application No. 10-2008-0018234 filed in the Korean Intellectual Property Office on Feb. 28, 2008, the entire contents of which are incorporated herein by reference.

BACKGROUND

1. Field of the Invention

The present invention relates to a thin film deposition apparatus and a method of maintaining the same.

2. Description of the Related Art

In manufacturing semiconductor devices, various apparatuses and processes have been developed to provide a high quality thin film on a substrate. Several methods have been used to form a thin film, employing surface reaction of a semiconductor substrate. The methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE). ALE was studied extensively for semiconductor deposition and electroluminescent display applications, and has been more recently referred to as Atomic Layer Deposition (ALD) for the deposition of a variety of materials.

Certain deposition apparatuses include one or more reactors housed in a chamber. Each of the reactors may include a substrate support on which a substrate is mounted.

It is sometimes necessary for a technician to have access to the interior of a chamber. Such a chamber is typically provided with a cover, which, when removed, allows access to components within a chamber. When such a cover is in the closed position, it provides a sealed environment within the chamber. Such a cover is typically manually dismounted and removed to gain access to the interior of the chamber.

The above information disclosed in this Background section is only for enhancement of understanding of the background of the invention and therefore it may contain information that does not form prior art already known in this country to a person of ordinary skill in the art.

SUMMARY

In one embodiment, a thin film deposition system includes: a chamber including a removable chamber cover; and a chamber cover lifting device connected to the chamber cover. The chamber cover lifting device is configured to move the chamber cover vertically between a lower position and an upper position. The apparatus also includes a level sensing device configured to detect whether the chamber cover is level.

In another embodiment, a deposition apparatus includes: a chamber body having a top face having an opening; a removable cover including a top surface; and a reflector mounted on the top surface of the removable cover. The reflector is formed of a material having a substantially higher reflectivity than the top surface of the removable cover.

In yet another embodiment, a method of maintaining a thin film deposition apparatus is provided. The method includes: vertically moving a removable chamber cover of a chamber in a deposition apparatus between a lower position and an upper position; detecting whether the chamber cover is level; and adjusting the chamber cover to be level if the chamber cover is not level.

Figure 1:
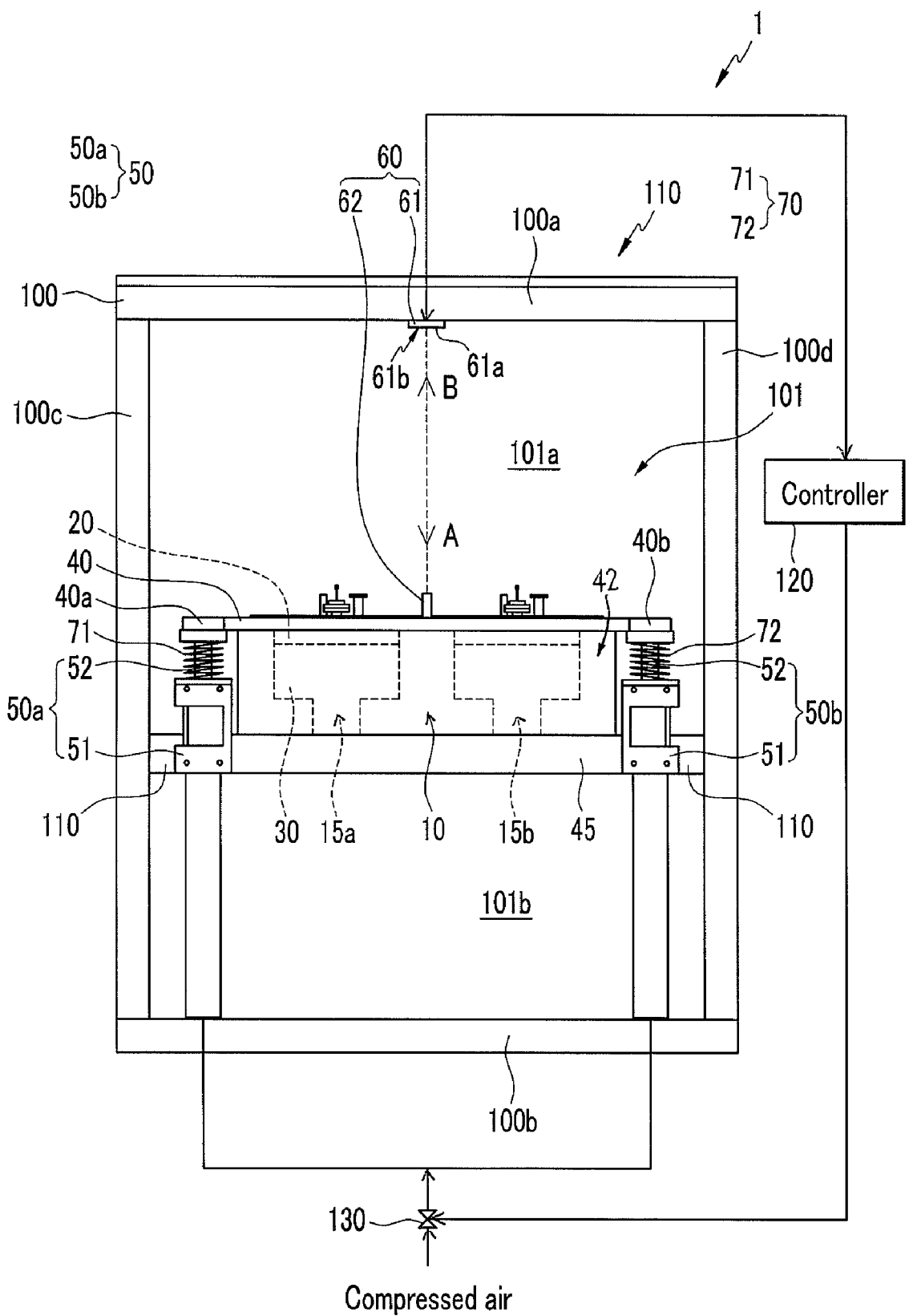
FIG. 1 is a cross-sectional view showing a thin film deposition apparatus including a level sensing device and a level maintaining device in accordance with one embodiment.

<Description of Reference Numerals in the Drawings>

| | |
|---|---|
| 10: chamber | 20: reactor cover |
| 30: substrate support | 40: chamber cover |
| 50: chamber cover lifting device | 60: level sensing device |
| 61: sensor | 62: reflector |
| 70: level maintaining device | 100: chamber frame |

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings are not to scale, but rather have dimensions exaggerated for clarity. Like reference numerals designate like elements throughout the specification. It will be understood that when an element, such as a device or part, is referred to as being "on" another element, it can be directly on the other element or intervening elements may also be present. In contrast, when an element is referred to as being "directly on" another element, there are no intervening elements present.

As described above, certain deposition apparatuses include one or more reactors housed in a chamber. Examples of reactors include, but are not limited to, a chemical vapor deposition reactor or an atomic layer deposition reactor. Each of the reactors may include a substrate support on which a substrate is mounted during deposition.

In some embodiments, the chamber may include a removable chamber cover. The chamber cover may include reactor covers which are part of the one or more reactors. The chamber cover may be opened to repair or maintain parts inside the chamber.

Such deposition apparatuses may also include a plurality of air cylinders to support the chamber cover. The cylinders can be provided with compressed air to move the chamber cover upwardly. By stopping provision of compressed air to the cylinders, the chamber cover may be moved downward. In this manner, the cylinders may move the chamber cover between a lower position (where the chamber is closed) and an upper position (where the chamber is fully opened for maintenance).

While moving the chamber cover vertically, the chamber cover may not be level. When the chamber cover is not level, an excessive load may be applied to one of the cylinders. Thus, the cylinder may be bent or damaged, which may pose a danger to a technician. In addition, the reactors may be damaged due to incomplete contact between the reactor cover and the substrate support. Thus, it would be advantageous to provide such a deposition apparatus with a mechanism to maintain the chamber cover to be level while moving the chamber cover vertically.

FIG. 1 is a cross-sectional view showing a thin film deposition system according to one embodiment. The illustrated system 1 includes a deposition apparatus 110, a controller 120, and an air control valve 130.

The illustrated thin film deposition apparatus 110 includes a chamber frame 100, a chamber 10 inside the chamber frame 100, and a plurality of reactors 15a, 15b inside the chamber 10. The apparatus 110 also includes a removable chamber cover 40, a chamber cover lifting device 50, a level sensing device 60, and a level maintaining device 70. The level sensing device 60 and the level maintaining device 70 serve to maintain the chamber cover 40 in a level condition.

The chamber frame 100 may include a top portion 100a, a bottom portion 100b, and sidewalls 100c, 100d that together define a space 101 to house the chamber 10 therein. In the illustrated embodiment, the chamber 10 is positioned generally at a vertically middle position inside the space 101. In the context of this document, an upper portion of the space 101 above the chamber 10 may be referred to as an upper space 101a, and a lower portion of the space 101 below the chamber 10 may be referred to as a lower space 101b. The chamber frame 100 may include bars 110 that extend in a substantially horizontal direction and to help support the chamber 10. The chamber frame 100 may also support the chamber cover lifting device 50.

The chamber 10 includes a chamber body having a top face having an opening, and the removable chamber cover 40. The chamber body may include a sidewall 42, and a base plate 45. The chamber cover 40 is vertically movable between an upper position and a lower position in the upper space 101a of the chamber frame 100. The chamber cover 40 seals and forms an upper portion of the chamber 10 when it is at the lower position. The sidewall 42 extends substantially vertically between the chamber cover 40 and the base plate 45. The base plate 45 is positioned below the sidewall 42 of the chamber cover 40. The base plate 45 may be fixed to the bars 110 of the chamber frame 100.

The chamber 10 may include a plurality of reactors 15a, 15b defined by the chamber cover 40, the sidewall 42, and the base plate 45. Each of the reactors 15a, 15b may include a reactor cover 20 and a substrate support 30 below the reactor cover 20. Each of the reactors 15a, 15b includes a reaction space therein.

The substrate support 30 may include a bottom portion that supports a substrate and a reactor wall extending from peripheral portions of the bottom portion. The bottom portion and the reactor wall may be integral with each other. The reactor cover 20 may have a bottom surface that is spaced apart from the bottom portion of the substrate support 30. During a deposition process, the reactor wall of the substrate support 30 is in contact with the reactor cover 20, thus forming the reaction space. In one embodiment, the reactor cover 20 may be attached to a lower surface of the chamber cover 40. In such an embodiment, the reactor cover 20 may be moved vertically along with the chamber cover 40.

The chamber cover lifting device 50 serves to move the chamber cover 40 vertically. In the illustrated embodiment, the chamber cover lifting device 50 includes a plurality of cylinders 50a, 50b attached to bottom surfaces of first and second ends 40a, 40b of the chamber cover 40. In the illustrated embodiment, a pair of cylinders 50a, 50b are provided. A skilled artisan will appreciate that the number of cylinders can vary widely, depending on the design of the deposition apparatus.

The cylinders 50a, 50b are together configured to vertically move the chamber cover 40 using compressed air. Each of the illustrated cylinders 50a, 50b includes a fixed portion 51 and a reciprocating portion 52. The reciprocating portion 52 is vertically movable by the operation of the compressed air. The reciprocating portion 52 is connected to the chamber cover 40 such that the chamber cover 40 can be moved vertically by the movement of the reciprocating portion 52. Thus, the chamber cover 40 is moved upward while the reciprocating portions 52 move upward, and is moved downward while the reciprocating portions 52 move downward. In order to maintain the chamber cover 40 level when the chamber cover 40 is lifted up, the same amount of the compressed air should be simultaneously supplied to the two cylinders 50a and 50b.

The level sensing device 60 serves to detect whether or not the chamber cover 40 is level. The level sensing device 60 includes a sensor 61 that includes a light-emitting portion 61a and a light-receiving portion 61b. In the illustrated embodiment, the sensor 61 is fixed to the top portion 100a of the chamber frame 100. The light-emitting portion 61a of the sensor 61 is configured to emit a light beam toward the chamber cover 40. The light-receiving portion 61b of the sensor 61 is configured to detect a light beam reflected by the chamber cover 40. The light sensing device 60 is configured to provide a signal to the controller 120 if the light-receiving portion 61b of the sensor 61 receives a light beam.

The level sensing device 60 also includes a reflector 62 on the chamber cover 40. In the illustrated embodiment, the reflector 62 is positioned at the center of a top surface of the chamber cover 40. The reflector 62 is configured to reflect the light beam emitted from the light-emitting portion of the sensor 61. The reflector 62 may be formed of a specular material. In one embodiment, the reflector 62 may be formed of polycarbonate. In other embodiments, the reflector 62 may be formed of a metallic material having high reflectivity. The sensor 61 is positioned above the reflector 62, and is spaced apart from the chamber cover 40, and is fixed to the chamber frame 100. In other embodiments, the sensor 61 can be fixed to other features in the clean room that are independent of the chamber 10. In the illustrated embodiment, the top surface of the chamber cover 40 is formed of a non-reflective material or a material that has less reflectivity than the reflector 62.

Figure 2:
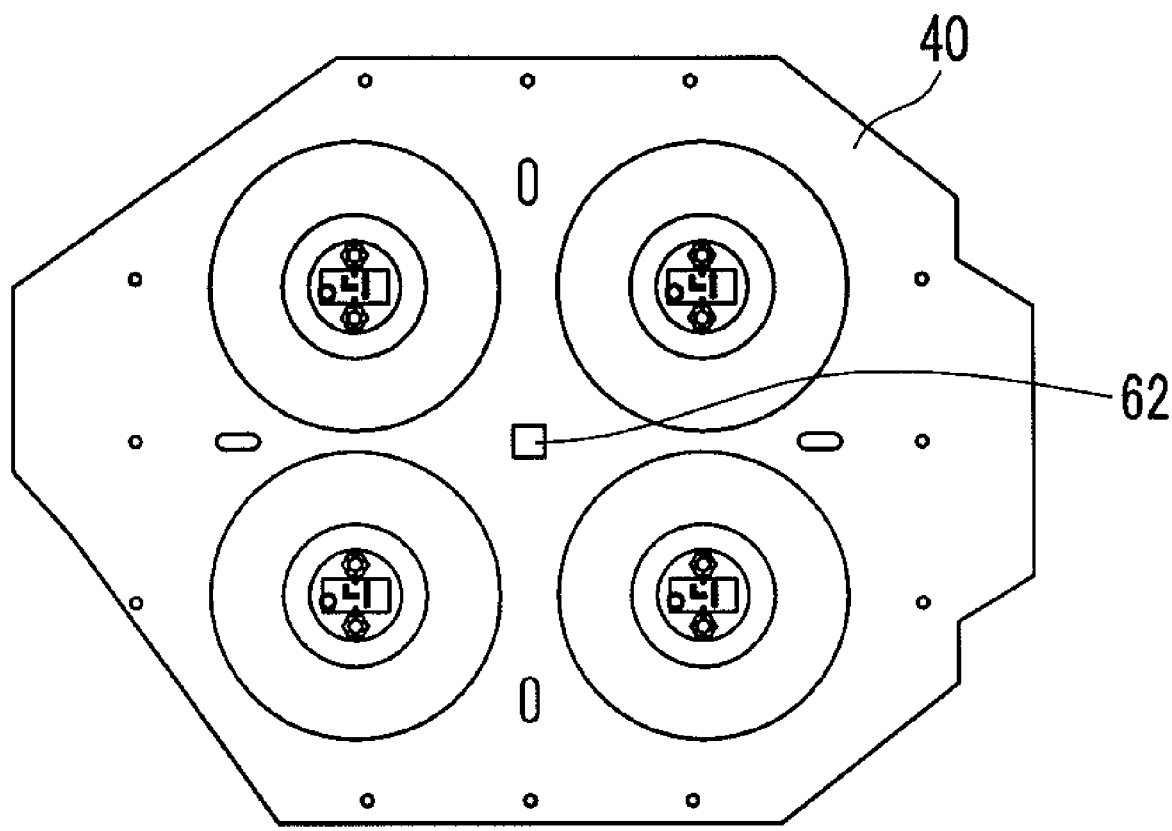
FIG. 2 is a top plan view of a chamber cover of the thin film deposition apparatus of FIG. 1.

Referring to FIG. 2, the reflector 62 is mounted on the chamber cover 40. The reflector 62 is positioned at the center of the chamber cover 40 in the illustrated embodiment. In one embodiment, the reflector 62 may have a square shape having a size of about 50 mm×about 50 mm. In other embodiments, the shape, size, and material of the reflector 62 may vary widely, depending on the reflectivity thereof and the sensitivity of the sensor 61.

Referring again to FIG. 1, the controller 120 serves to control the operation of the apparatus. The controller 120 may include a general purpose computer including a central processing unit (CPU), a volatile and/or non-volatile memory device, a storage device, and a user interface (e.g., a monitor, a keyboard, a keypad, etc.). The controller 120 may control the operation of the valve 130. In one embodiment, the controller 120 receives signals from the sensor 61, and controls the operation of the valve 130 based on the signals.

In one embodiment, the controller 120 may also perform a chemical vapor deposition (CVD) process. In such an embodiment, at least two kinds of reaction materials may be simultaneously supplied into the reaction spaces of the reactors to grow thin films on substrates. In another embodiment, the controller may perform an atomic layer deposition (ALD) process. In such an embodiment, at least two kinds of reaction materials are sequentially and alternately supplied into the reaction spaces of the reactors to grow thin films on substrates. In other embodiments, a CVD or ALD process may be combined with plasma generation.

The valve 130 serves to control an amount of compressed air supplied to the cylinders 50a, 50b. A skilled artisan will appreciate that two or more valves may be used for the cylinders 50a, 50b. Examples of valves include, but are not limited to, a solenoid valve and a pneumatic valve.

Referring still to FIG. 1, during operation, the sensor 61 emits a light beam A toward the chamber cover 40. When the chamber cover 40 is level, a light beam B reflected from the reflector 62 travels along the same path as the light beam A, but in the opposite direction from that of the light beam A, and reaches the sensor 61. Thus, the light-receiving portion of the sensor 61 can detect the light beam B. If, however, the chamber cover 40 is not level, the light beam B reflected from the reflector 62 travels at an angle with the path of the light A, and does not reach the sensor 61. Thus, the sensor 61 can determine whether or not the chamber cover 40 is level.

The level maintaining device 70 serves to maintain the chamber cover 40 level. The illustrated level maintaining device 70 includes a plurality of springs including a first spring 71 and a second spring 72. In other embodiments, the level maintaining device 70 may include any suitable device that can provide a self-restoring force to the chamber cover 40. In the illustrated embodiment, only two springs are shown. In other embodiments, a different number of springs (for example, 3, 4, 5, 6, 7, 8, 9, 10, or greater) may be used, depending on the number of cylinders.

In the illustrated embodiment, the springs 71, 72 are extension springs. The extension springs may be helical springs designed to store energy and resist a pulling force applied along the axis of the spring. In another embodiment, the springs 71, 71 may be compression springs. In other embodiments, any other suitable types of springs may be adapted for the use as the springs 71, 72. The springs 71, 72 have the same configuration as each others such that they exert the same amount of restoring force to opposite ends 40a, 40b of the chamber cover 40.

Each of the springs 71 and 72 surrounds a respective one of the reciprocating portions 52 of the cylinders 50a, 50b. The springs 71, 72 are located between the chamber cover 40 and the fixed portions 51 of the cylinders 50a, 50b. One end of each of the springs 71, 72 is fixed to the chamber cover 40 and the other end is fixed to one of the fixed portions 51 of the cylinders 50a, 50b. The springs 71 and 72 are stretched when the chamber cover 40 is lifted up to the upper position by the reciprocating portions 52 of the cylinders. The springs 71, 72 are compressed when the chamber cover 40 is moved down to the lower position by the reciprocating portions 52 of the cylinders 50a, 50b.

In the illustrated embodiment where the springs 71, 72 are extension springs, the springs 71, 72 resist a pulling force applied along the axis of the springs 71, 72. Thus, when the springs 71, 72 are in an extended state (for example, when the chamber cover 40 is at the upper position or between the upper and lower positions, see FIGS. 3 and 4), they tend to return to an unextended state (for example, when the chamber cover 40 is at the lower position, see FIG. 1). When the force is removed, the springs 71, 72 provide a downward restoring force to the chamber cover 40, and move the chamber cover 40 toward the lower position.

The springs 71, 72 each exert substantially the same restoring force to the chamber cover 40. When the springs 71, 72 are extended to the same extent, the springs 71, 72 provide substantially the same amount of downward pulling force to the ends 40a, 40b of the chamber cover 40. Thus, it is possible to maintain the chamber cover 40 to be level.

Figure 3:
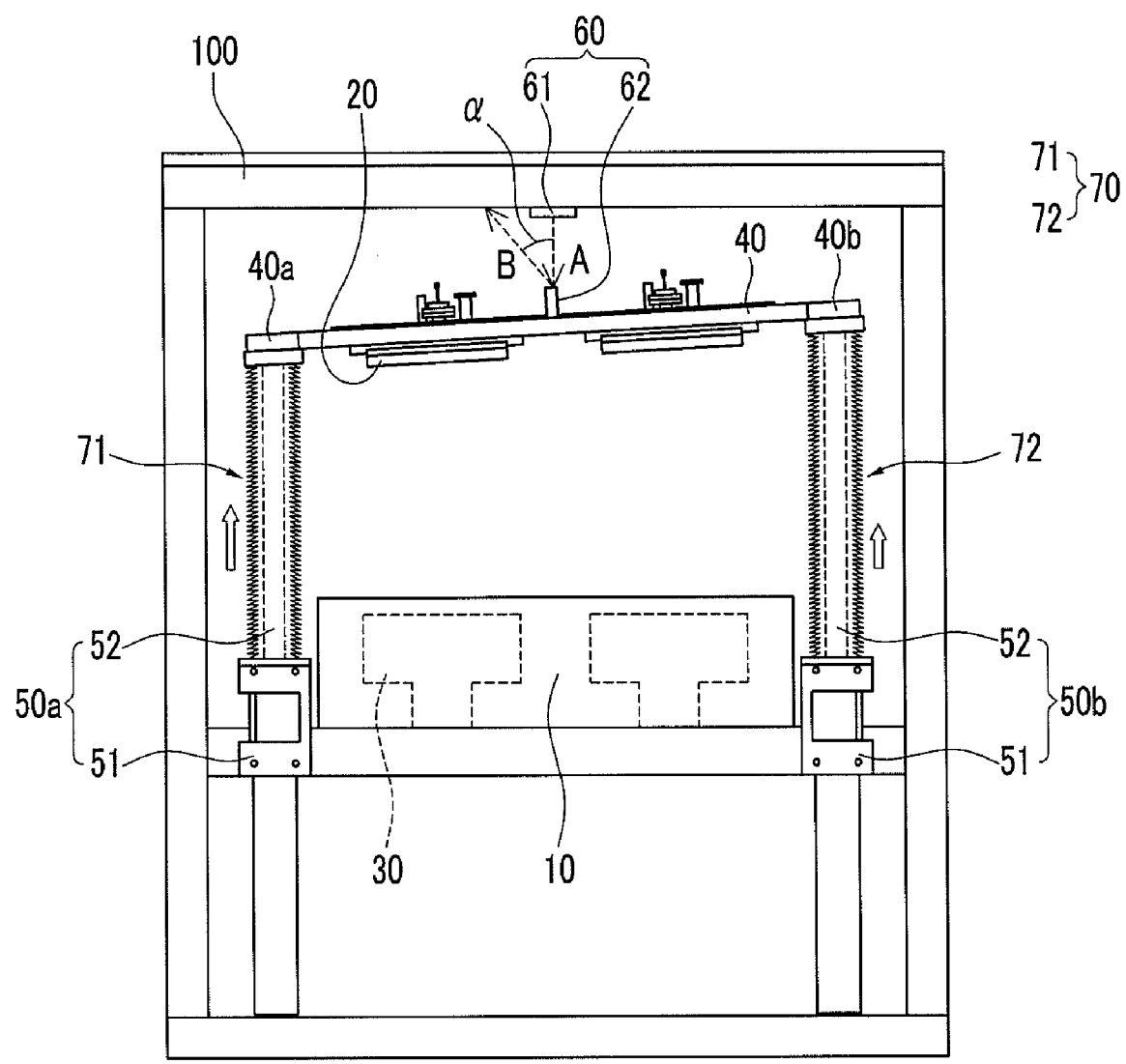
FIG. 3 is a cross-sectional view illustrating the operation of the level sensing device and the level maintaining device of FIG. 1 when the chamber cover is inclined.

Referring to FIG. 3, the operation of the level sensing device and the level maintaining device will be described below. FIG. 3 shows the thin film deposition apparatus of FIG. 1 when the chamber cover is inclined. The level sensing device 60 emits a light beam A from the sensor 61 to the reflector 62 when the chamber cover 40 is lifted using the first cylinder 50a and the second cylinder 50b. If the chamber cover 40 is inclined, the reflector 62 is also inclined. Thus, a light beam B reflected from the reflector 62 does not reach the sensor 61. In that instance, the level sensing device 60 cannot detect the light beam B, and the controller 120 (FIG. 1) determines that the chamber cover 40 is not level.

In one embodiment, the level sensing device 60 can have dimensions such that it can detect the reflected light beam B from the reflector 62 when an angle $\alpha$ between the light beam A (which is emitted from the sensor 61) and the light beam B is within about 3 degrees, or optionally within about 2 degrees. The angle $\alpha$ may depend on the vertical distance between the sensor 61 and the reflector 62. For example, the angle $\alpha$ may be about 2 to about 3 degrees when the chamber cover 40 is at the upper position while the angle $\alpha$ may be less than about 1 degree when the chamber cover 40 is at the lower position.

When the angle $\alpha$ is within a selected limit, the chamber cover 40 can be indicated as being "substantially level" in the context of this document. A skilled artisan will appreciate that the angle $\alpha$ can vary widely, depending on the type of the light sensor 61. If the sensor 61 detects the light beam B, it can provide the controller 120 with a signal indicating that the chamber cover 40 is level.

In the apparatus of FIG. 3, the first end 40a of the chamber cover 40 is lower than the second end 40b of the chamber cover 40. The first end 40a and the second end 40b are opposite ends of the chamber cover 40. When the level sensing device 60 determines that the chamber cover 40 is not level, the operations of the first and the second cylinders 50a, 50b are stopped, thereby stopping the vertical movement of the chamber cover 40. In one embodiment, this can be achieved by closing the valve 130 that controls air supply to the first and second cylinders 50a, 50b. In the illustrated embodiment where the first and second springs 71, 72 are extension springs, the second spring 72 is more extended than the first spring 71. Thus, the second spring 72 exerts a greater amount of downward restoring force to the chamber cover 40 than the first spring 71. Thus, by providing a different amount of force downwardly, the springs 71, 72 return the chamber cover 40 to a leveled state. A skilled artisan will appreciate that other types of springs can also provide leveling function similar to that of the extension springs.

When the chamber cover 40 becomes level, as detected by the level sensing device 60, the air control valve 130 is re-opened to supply the air to the cylinders 50a, 50b. Determining that the chamber cover 40 is level, and any adjustments needed by the level maintaining device 70 in order to achieve that level condition, is thus a condition that needs to be met for further vertical movement of the chamber cover 40. The chamber cover 40 is then allowed to continue to move upward.

Figure 4:
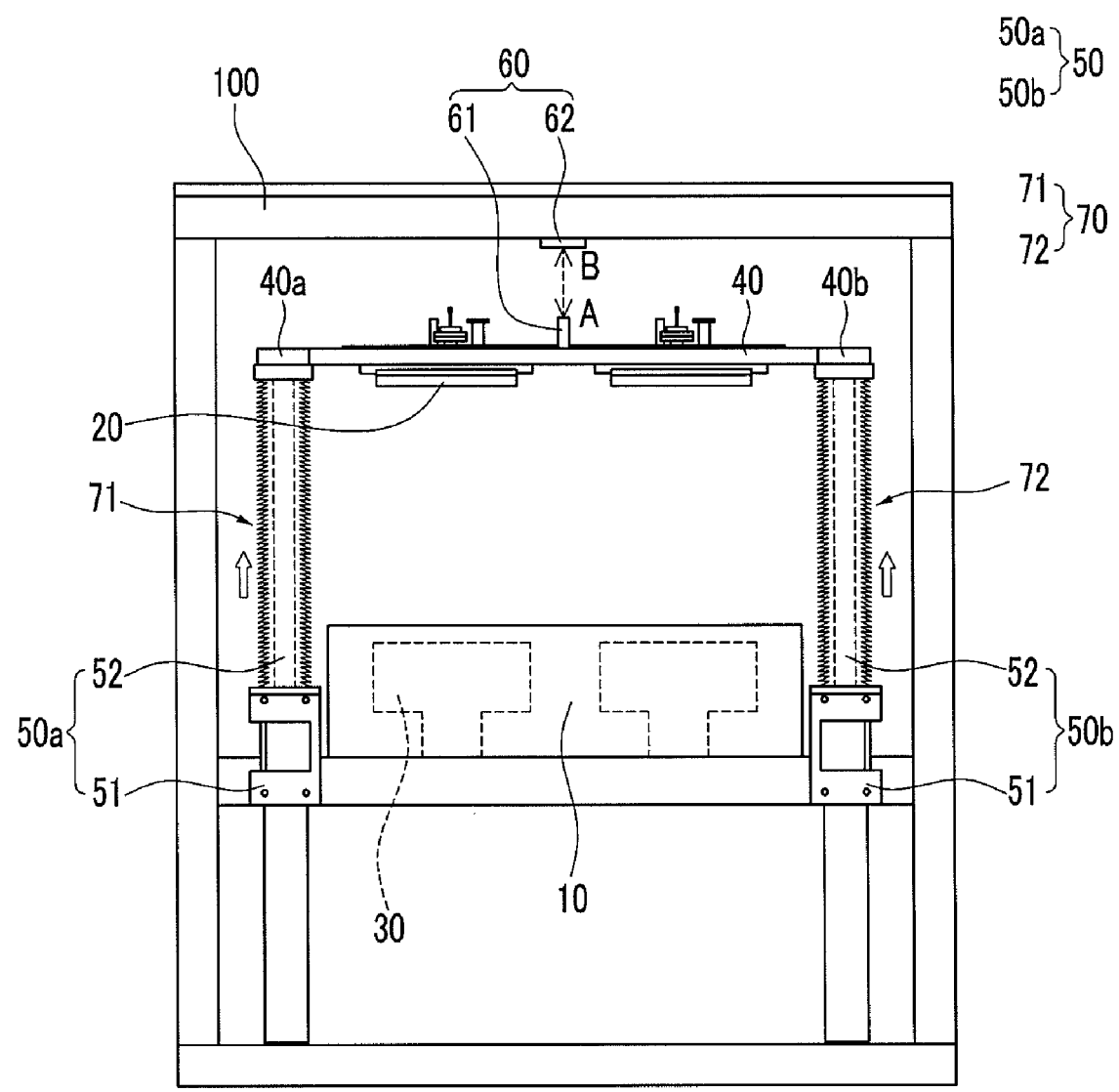
FIG. 4 is a cross-sectional view illustrating the operation of the level sensing device and the level maintaining device of FIG. 1 when the chamber cover is level.

FIG. 4 is a diagram illustrating operation of the level sensing device 60 and the level maintaining device 70 when the chamber cover is level. As shown in FIG. 4, when the chamber cover 40 is lifted using the first cylinder 50a and the second cylinder 50b, the level sensing device 60 emits a light beam from the sensor 61 to the reflector 62. When a light beam A emitted from the sensor 61 is reflected by the reflector 62, and a reflected light beam B reaches the sensor 61, it is determined that the chamber cover 40 is level. Thus, the chamber cover 40 continues to be lifted. Since the first spring 71 and the second spring 72 exert the same amount of restoring force to the chamber cover 40, they can prevent the chamber cover 40 from being inclined.

Next, a method of maintaining the thin film deposition apparatus with the use of the level sensing device 60 and the level maintaining device 70 will be described below. First, as shown in FIG. 4, the chamber cover 40 covering the chamber 10 is lifted up using the chamber cover lifting device 50.

Then, while the chamber cover 40 is lifted, the level sensing device 60 determines whether the chamber cover 40 is level. If the level sensing device 60 determines that the chamber cover 40 is level, the chamber cover lifting device 50a and 50b continues to move the chamber cover 40 to the upper position. When the chamber cover 40 is at the upper position, a chamber maintenance process can be performed.

However, as shown in FIG. 3, when the level sensing device 60 determines that the chamber cover 40 is not level, the operations of the chamber cover lifting device 50 are stopped. Then, the chamber cover 40 is adjusted to be level by the level maintaining device 70 connected to the chamber cover 40. When the chamber cover 40 is restored to be level, the operation of the chamber cover lifting device 50 is resumed to lift the chamber cover 40.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

We claim:

1. A thin film deposition system comprising:
   a chamber including a removable chamber cover;
   a chamber cover lifting device connected to the chamber cover, the chamber cover lifting device being configured to move the chamber cover vertically between a lower position and an upper position; and
   a level sensing device configured to detect whether the chamber cover is level.

2. The system of claim 1, wherein the level sensing device comprises:
   a sensor positioned above the chamber cover, the sensor including a light-emitting portion and a light-receiving portion, the light-emitting portion being configured to emit a light beam toward the chamber cover; and
   a reflector attached to a top surface of the chamber cover, the reflector being configured to reflect the light beam toward the light-receiving portion of the sensor only when the chamber cover is substantially level.

3. The system of claim 2, wherein the sensor provides a signal indicating that the chamber cover is level when the sensor receives a light beam reflected from the reflector.

4. The system of claim 3, further comprising a controller configured to receive the signal from the sensor and to control the chamber cover lifting device, based at least partly on the signal.

5. The system of claim 2, wherein the sensor is positioned vertically above the reflector.

6. The system of claim 5, further comprising a chamber frame including a portion above the chamber, wherein the sensor is fixed to the portion of the chamber frame.

7. The system of claim 1, wherein the chamber cover lifting device comprises a plurality of cylinders attached to different portions of the chamber cover, and wherein the chamber cover lifting device is configured to move the chamber cover vertically by movement of the cylinders.

8. The system of claim 7, wherein each of the cylinders comprises a fixed portion and a reciprocating portion that is vertically movable.

9. The system of claim 8, further comprising a level maintaining device configured to maintain the chamber cover to be level.

10. The system of claim 9, wherein the level maintaining device comprises a plurality of springs.

11. The system of claim 10, wherein each of the springs surrounds the reciprocating portion of a respective one of the cylinders and is located between the chamber cover and the fixed portion of the cylinder.

12. The system of claim 11, wherein the springs comprise extension springs, and wherein the springs are in an extended state when the chamber cover is between the lower position and the upper position.

13. The system of claim 7, wherein the cylinders are configured to receive air to move upward, and wherein substantially no air is supplied to the cylinders when the sensor does not receive a light beam reflected from the reflector.

14. The system of claim 1, further comprising a level maintaining device configured to maintain the chamber cover to be level.

15. The system of claim 14, wherein the level maintaining device comprises a plurality of springs.

16. The system of claim 15, wherein the springs comprise extension springs, and wherein the springs are in an extended state when the chamber cover is between the lower position and the upper position.

* * * * *